(12) United States Patent
Zhang et al.

(10) Patent No.: US 9,946,151 B2
(45) Date of Patent: Apr. 17, 2018

(54) METHOD FOR PRODUCING A MASK AND THE MASK

(71) Applicant: BOE Technology Group Co., Ltd., Beijing (CN)

(72) Inventors: Xiaolei Zhang, Beijing (CN); Seiji Fujino, Beijing (CN); Xiaohu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 92 days.

(21) Appl. No.: 15/104,931

(22) PCT Filed: Aug. 11, 2015

(86) PCT No.: PCT/CN2015/086655
§ 371 (c)(1),
(2) Date: Jun. 15, 2016

(87) PCT Pub. No.: WO2016/165247
PCT Pub. Date: Oct. 20, 2016

(65) Prior Publication Data
US 2017/0139315 A1    May 18, 2017

(30) Foreign Application Priority Data
Apr. 17, 2015    (CN) .......................... 2015 1 0184143

(51) Int. Cl.
*G03F 1/50* (2012.01)
*G03F 1/24* (2012.01)
*G03F 1/42* (2012.01)

(52) U.S. Cl.
CPC .................. *G03F 1/24* (2013.01); *G03F 1/42* (2013.01); *G03F 1/50* (2013.01)

(58) Field of Classification Search
CPC ..... G03F 1/24; G03F 1/42; G03F 1/00; G03F 1/50
(Continued)

(56) References Cited

U.S. PATENT DOCUMENTS

| | | | |
|---|---|---|---|
| 3,649,273 A | * | 3/1972 | Miller ....................... G03F 1/90 396/661 |
| 9,075,307 B2 | | 7/2015 | Kurafuchi et al. |
| 2002/0142234 A1 | | 10/2002 | Hansel et al. |

FOREIGN PATENT DOCUMENTS

| | | |
|---|---|---|
| CN | 201556025 U | 8/2010 |
| CN | 102138104 A | 7/2011 |
| CN | 104407496 A | 3/2015 |

OTHER PUBLICATIONS

International Search Report and Written Opinion for International Application No. PCT/CN2015/086655, dated Jan. 7, 2016, 9 pages.
(Continued)

*Primary Examiner* — John A McPherson
(74) *Attorney, Agent, or Firm* — Westman, Champlin & Koehler, P.A.

(57) ABSTRACT

Embodiments of the present disclosure provide a method for producing a mask and a mask obtained by this method. The mask is configured to shield light during an exposure of a product. The method includes steps of: producing a composite membrane, wherein the composite membrane includes a first protection layer, a bonding layer, a shielding layer and a second protection layer stacked in sequence; only cutting the first protection layer, the bonding layer and the shielding layer of the composite membrane, wherein a cutting line corresponds to a shape of an area to be exposed of the product; removing the first protection layer and cut portions of the bonding layer and the shielding layer which have a same shape as that of the area to be exposed; attaching the formed composite membrane onto a base (Continued)

substrate of an open mask, and removing the second protection layer.

18 Claims, 4 Drawing Sheets

(58) Field of Classification Search
USPC .......................................................... 430/5
See application file for complete search history.

(56) References Cited

OTHER PUBLICATIONS

English translation of Box No. V of the Written Opinion for the International Searching Authority of International Application No. PCT/CN2015/086655, dated Jan. 7, 2016, 2 pages.

* cited by examiner

METHOD FOR PRODUCING A MASK AND THE MASK

CROSS-REFERENCE TO RELATED APPLICATION

This application is a 371 National Stage Application of International Application No. PCT/CN2015/086655, filed on Aug. 11, 2015, which has not yet published, and which claims the benefit of Chinese Patent Application No. 201510184143.7, filed on Apr. 17, 2015 and entitled as "Method For Producing A Mask And The Mask" in the State Intellectual Property Office of China, the disclosures of which is incorporated herein in their reference.

BACKGROUND OF THE INVENTION

Field of the Invention

The present disclosure relates to the technical field of liquid crystal, and particularly, to a method for producing a mask and the mask obtained by the method.

Description of the Related Art

An Ultra Violet (UV) mask is a membrane used for, for example, an OLED packaging assembly equipment or an UV curing equipment. It can effectively shield the UV light when the curing is done by an illumination of the UV light, so that the devices such as OLEDs can be protected from being illuminated by the UV light, thereby avoiding an adverse affection of the UV light on the OLED devices and even damage to them. The UV mask can be used for encapsulation adhesive-curing equipments, and can be used to reflect and shield the UV light by a metal layer on a surface of the UV mask. In this way, devices within a light emitting area of the OLED are protected, and meanwhile an encapsulation adhesive exposed to an illumination of the UV light is exposed, so as to achieve curing of the encapsulation adhesive by the UV light.

A conventional method for producing the UV mask is to provide a metal layer on a surface of a base substrate of an open mask. However, such method involves processes such as coating of photo resist, exposure, development, etching, sputtering or the like, so that a production load is generated and a long time is consumed.

SUMMARY

In order to solve the above problems in the prior art, one or more of embodiments of the present disclosure provide a method for producing a mask and the mask produced by the method.

In accordance with an aspect, it provides a method for producing a mask, wherein the mask is configured to shield light during an exposure of a product, the method comprising the steps of:

producing a composite membrane, wherein the composite membrane comprises a first protection layer, a bonding layer, a shielding layer and a second protection layer stacked in sequence;

only cutting the first protection layer, the bonding layer and the shielding layer of the composite membrane, wherein a cutting line corresponds to a shape of an area to be exposed of the product;

removing the first protection layer of the composite membrane and cut portions of the bonding layer and the shielding layer which have a same shape as that of the area to be exposed;

attaching the resulting composite membrane onto a base substrate of an open mask, and removing the second protection layer, so as to form the mask.

In accordance with another aspect of the present invention, it provides a mask, wherein the mask is configured to shield light during an exposure of a product, the mask comprising a base substrate of an open mask, a bonding layer attached onto the base substrate of the open mask, and a shielding layer attached onto the bonding layer;

wherein the shielding layer and the bonding layer have a shape corresponding to that of an area except an area to be exposed of the product.

In technical solutions provided by the one or more of the embodiments of the present disclosure, the mask can be produced by a composite membrane structure composed of a plurality of layers of films. The mask is obtained by cutting the composite membrane in accordance with the shape of the area to be exposed of the product, removing the protection layer of the composite membrane and cut portions of the bonding layer and the shielding layer corresponding to the area to be exposed, and attaching the formed composite membrane onto the base substrate of the open mask. This can significantly reduce production complexity of the mask, and reduce production time.

BRIEF DESCRIPTION OF THE DRAWINGS

In order to better clearly explain the technical solutions of the one or more of the embodiments of the present disclosure, the drawings used for the one or more embodiments are discussed briefly herein. Obviously, the following drawings are directed to only parts of the embodiments, and the person skilled in the art can obtain other figures from the above drawings without any inventive labor.

DETAILED DESCRIPTION OF THE EMBODIMENTS

In order to enable objectives, technical solutions and advantages of the present disclosure to become more clear, the implementations of the embodiments of the present disclosure are described in detail in conjunction with the drawings attached herein.

Figure 1:
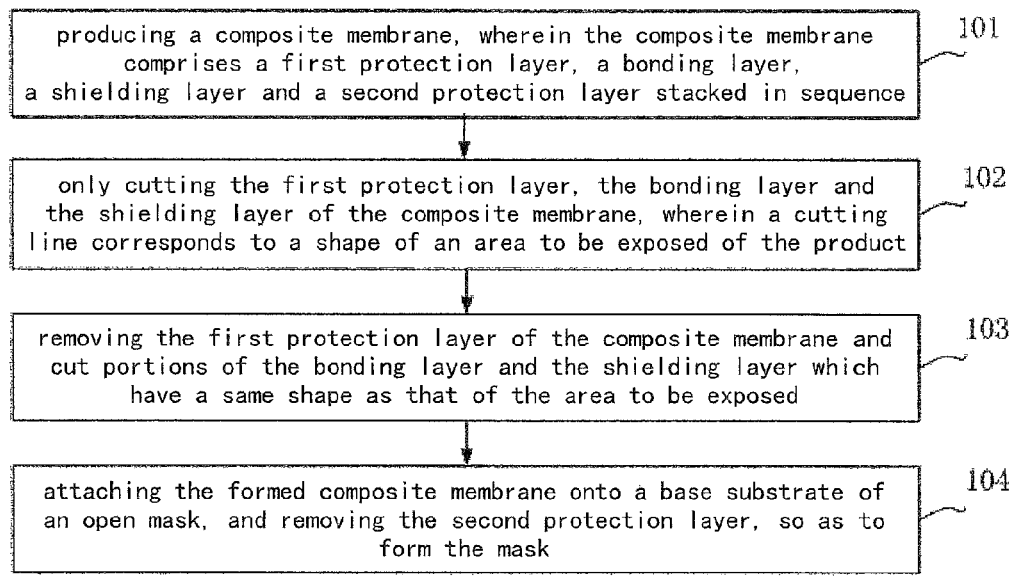
FIG. 1 is a flowchart of a method for producing a mask in accordance with an embedment of the present disclosure.

FIG. 1 is a flowchart of a method for producing a mask in accordance with an embodiment of the present disclosure, wherein the mask is used to shield light during exposure of a product. As shown, the method includes:

S101, producing a composite membrane, which includes a first protection layer, a bonding layer, a shielding layer and a second protection layer.

Figure 2:
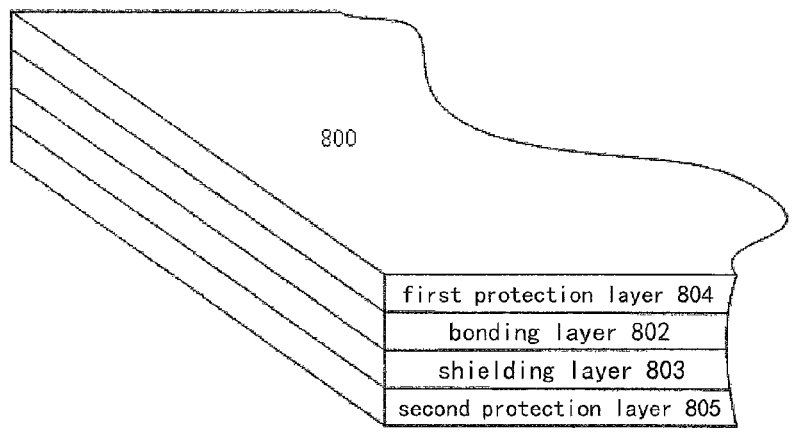
FIG. 2 is a schematic view for showing a structure of a composite membrane initially produced in accordance with the embodiment of the present disclosure.

As shown in FIG. 2, the step for producing the composite membrane 800 may include stacking the first protection layer 804, the bonding layer 802, the shielding layer 803 and the second protection layer 805 in sequence. The first protection layer 804 and the second protection layer 805 are a front protection layer and a rear protection layer, located outside the shielding layer 803 and the bonding layer 802 respectively. The shielding layer 803 is configured to shield light, so as to protect light emitting devices from being illuminated during a curing process by UV light illumination. The bonding layer 802 is used to attach the shielding layer 803 and a base substrate of an open mask (which will be used subsequently) together.

Optionally, the shielding layer 803 is of total reflective material. The shielding layer 803 of the total reflective material may reflect the UV light, and avoid increasing of temperature due to the mask absorbing the UV light. In addition, the shielding layer 803 and the bonding layer 802 have a uniformity less than 20 μm, so as to satisfy requirements about process tests. Preferably, the total reflective material may be metal material.

S102, only cutting the first protection layer, the bonding layer and the shielding layer of the composite membrane, wherein a cutting line corresponds to the shape of the area to be exposed on the product.

Figure 3:
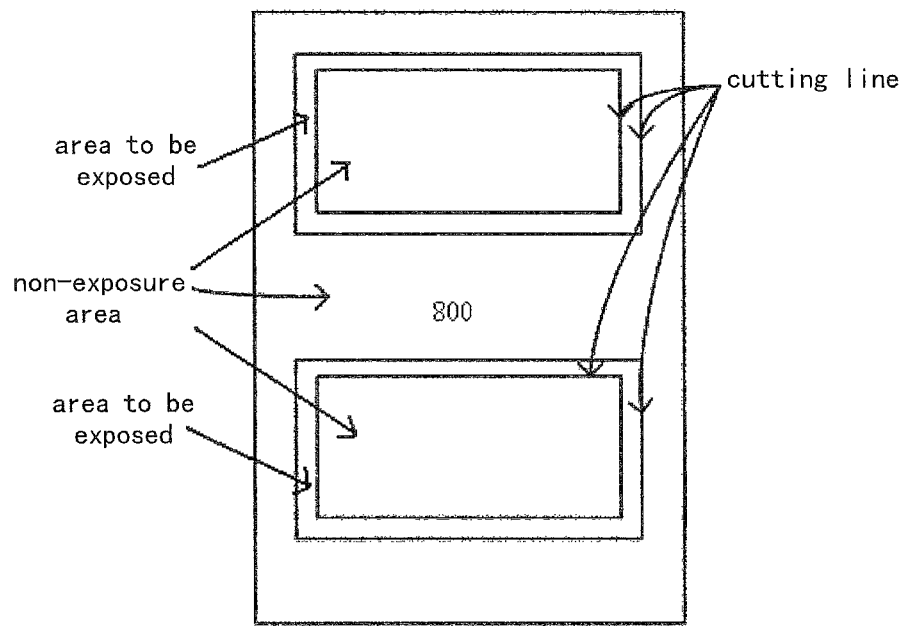
FIG. 3 is a schematic view for a cut area on the composite membrane initially produced in accordance with the embodiment of the present disclosure.
Figure 4:
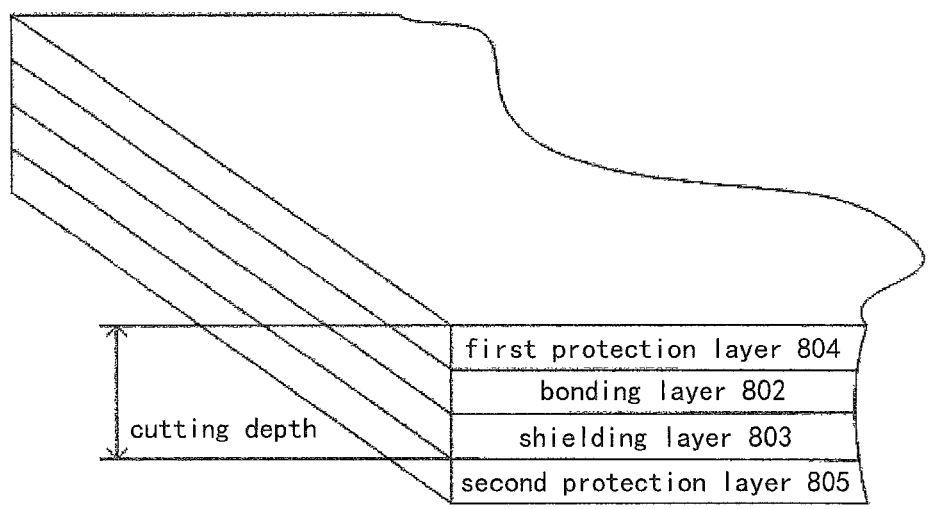
FIG. 4 is a schematic view for showing a cutting depth on the composite membrane in accordance with the embodiment of the present disclosure.

As shown in FIGS. 3 and 4, before cutting, the shape and position of the area to be cut as well as a cutting depth upon cutting may be determined based on the area to be exposed of the product, for example, the exposure area of the encapsulation adhesive. The area corresponding to the area to be exposed (for example the exposure area of the encapsulation adhesive) may be of any shape. The one or more of the embodiments of the present disclosure do not make any limit to this. In an embodiment, in order to reduce complexity of the cutting and improve a yield rate of product, it is possible to select the area corresponding to the area to be exposed (for example, the exposure area of the encapsulation adhesive) to have a rectangular shape (for example, as shown in FIG. 3). Of course, in a case where the product has a very particular shape, it is also possible to perform cutting with other shapes, depending on the area to be exposed (for example, the exposure area of the encapsulation adhesive). In order to keep the second protection layer intact, an ideal value of the cutting depth upon cutting shall be a value by which the first protection layer, the bonding layer and the shielding layer are just cut through (as shown in FIG. 4).

The cutting process is done as follows: determining a cutting line used for delimiting a non-exposure area (for example, an area for light emitting devices) and an area to be exposed (for example, an exposure area for the encapsulation adhesive); and cutting the first protection layer, the bonding layer and the shielding layer of the composite membrane along the cutting line. The cutting process can be performed by a conventional film cutting machine, for example, a film cutting device.

S103, removing the first protection layer of the composite membrane and portions of the bonding layer and the shielding layer corresponding to the area to be exposed in terms of shape.

Figure 5:
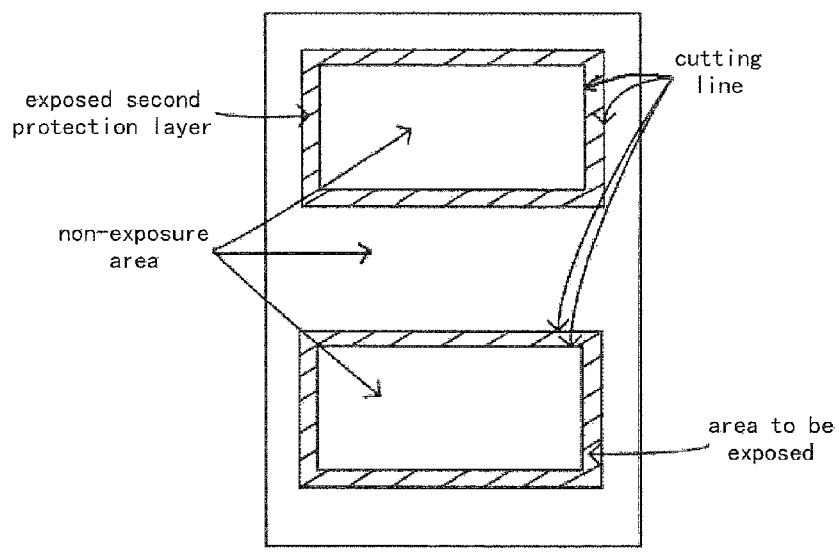
FIG. 5 is a schematic view for showing a structure of the composite membrane in accordance with the embodiment of the present disclosure, wherein a first protection layer and portions of a bonding layer and a shielding layer corresponding to an area to be exposed have been removed, and a dashed portion is an exposed second protection layer.

The removing step is to peel off the first protection layer 804 of the composite membrane 800 and then peel off the portions of the bonding layer 802 and the shielding layer 803 corresponding to the area to be exposed, for example, a rectangular ring part between two closed cutting lines as shown in FIG. 3. Of course, in order to facilitate operation, it is also possible to remove the first protection layer 804 and the portions of the bonding layer and the shielding layer corresponding to the area to be exposed together. The resulting composite membrane obtained after the removing step is shown in FIG. 5. The region shown by the dashed lines in FIG. 5 is a part of the second protection layer exposed out by removing the first protection layer and the portions of the bonding layer and the shielding layer corresponding to the area to be exposed.

S104, attaching the obtained composite membrane onto the base substrate of the open mask, and removing the second protection layer, so as to form the mask.

Figure 6:
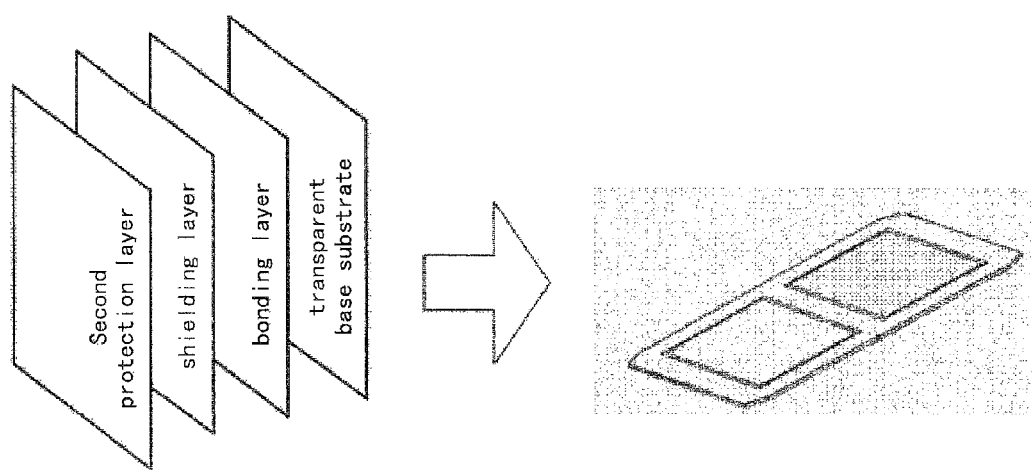
FIG. 6 is a schematic view for showing a structure of the mask in accordance with the embodiment of the present disclosure, wherein a left figure thereof shows the layer sequence of the composite membrane, and a right figure thereof shows a state in which the composite membrane is attached to a base substrate of an open mask.

When the obtained composite membrane is attached onto the base substrate of the open mask (as shown in FIG. 6), they can be aligned and attached together by an in-line laminator equipment. Specifically, the alignment operation can be performed manually or automatically by a diagonal position double-CCD (Charge-coupled Device) alignment system.

With reference to FIG. 6, its left figure shows an attaching sequence of respective layers, and its right figure shows a formation after the attaching.

Actually, the product obtained in the step S104 is the mask of the present disclosure. In order to make quality of the mask better and precision thereof higher, the obtained mask after the step S104 can be further treated by a defoaming process and a curing process.

Gas bubbles present between the bonding layer and the base substrate will affect whole flatness of the mask and hence the packaging process thereof. Therefore, it is necessary to place the obtained mask into a high-vacuum apparatus so as to perform the defoaming process. Currently, the high-vacuum apparatus may be a Vacuum Assembly System (VAS), a Vacuum Heating plate (VHP) or a Load Inter-Lock Vacuum Chamber.

Preferably, during the curing process, the composite membrane is cured onto the base substrate of the open mask by a thermosetting adhesive or an UV adhesive. The curing adhesive used in the curing process shall need to satisfy light resistance and durability, so to ensure that there are no film falling or displacement after multiple UV exposures. Meanwhile, the curing adhesive tends to dissolve in a solution, and thus it is easy to remove the membrane. Alternatively, it is possible to remove the curing adhesive by other methods. The curing process may be done by an UV curing apparatus and an ordinary heating plate.

It should be noted that in an embodiment, the bonding layer and/or the shielding layer are/is of a soluble material or a laser-peeling off material. For example, in a specific embodiment, the bonding layer may be of a soluble material. In that case, when the development of the product is completed, for example, when the encapsulation adhesive is exposed and cured, the bonding layer can be removed by a solution such as acetone. Because the bonding layer is located between the shielding layer and the base substrate of the open mask, the bonding layer and the shielding layer can be removed by dissolving away the bonding layer. In a further specific embodiment, both of the shielding layer and the bonding layer may be of soluble materials. Further, the shielding layer and the bonding layer can be dissolved within the acetone. In this condition, when the development of the product is finished, for example when the encapsulation adhesive is exposed and cured, the bonding layer and the shielding layer can be removed by a solution such as acetone. The base substrate of the open mask would not be adversely affected in the case that the bonding layer and the shielding layer are removed by dissolving the bonding layer or the bonding layer and the shielding layer. The base substrate of the open mask after removing the membrane provided thereon can be restored to its original state, for cyclic utilization of subsequent product development. In a further embodiment, the bonding layer can be of a laser-peeling off material. Because the bonding layer is located between the shielding layer and the base substrate of the open mask, the bonding layer and the shielding layer can be removed by removing the bonding layer. In a further embodiment, the shielding layer and the bonding layer both can be a laser-peeling off material. In that case, when the development of the product is completed, for example, when the encapsulation adhesive is exposed and cured, the bonding layer and the shielding layer can be removed. The base substrate of the open mask would not be adversely affected by such removal process. The base substrate of the open mask after removing the membrane provided thereon can be restored to its original state, for cyclic utilization of subsequent product development. It should be explained that the above mentioned removal process can be done by deteriorating the material of the membrane by an intense laser etching or a high temperature baking or the like, and then removing the membrane. The embodiments of the present disclosure do not make any specific limitation to this.

The alternative technical solutions as described above can be used to form an alternative embodiment of the present disclosure by combining them in any form, and they are not repeated herein.

Of course, the method for producing the mask can not only be applied into packaging of the OLEDs, but also can be used in other processes of shielding components/elements.

One or more of the embodiments of the present disclosure provide a method for producing a mask which is achievable on the basis of existing equipments in a current production line and thus simple. The mask can be manufactured by a composite membrane structure composed of a plurality of layers of films. Specifically, the mask is obtained by cutting the composite membrane in accordance with the shape of the area to be exposed of the product, removing the protection layer of the composite membrane and cut portions of the bonding layer and the shielding layer corresponding to the area to be exposed, and attaching the formed composite membrane onto the base substrate of the open mask. This can significantly reduce production complexity of the mask, and reduce the production time. Further, since the bonding layer and/or the shielding layer may be of soluble materials or laser-peeling off materials, the composite membrane can be removed easily. Therefore, after development of a product is completed, it is possible to easily remove the composite membrane, restore the base substrate of the open mask, and recycle the restored open mask in development of another product. In this way, the production cost and the production time for producing the mask can be reduced, and the production cycle can be decreased. The development progress of the product would not be affected by production of the mask.

Figure 7:
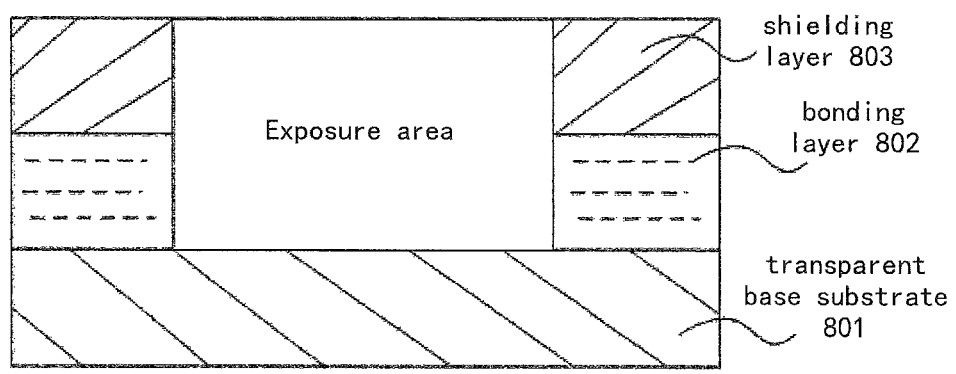
FIG. 7 is a structurally schematic view for showing a cross section of the mask in accordance with the embodiment of the present disclosure.

FIG. 7 is a structurally schematic view for showing a cross section of the mask provided by an embodiment of the present disclosure. With reference to FIG. 7, the mask includes a base substrate of an open mask 801, a bonding layer 802 attached onto the base substrate of the open mask 801, and a shielding layer 803 attached onto the bonding layer 802, wherein the shielding layer and the bonding layer correspond to an area except the area to be exposed of the product, i.e., a non-exposure area of the product. An area of the transparent base substrate 801 which is not shielded by the shielding layer and the bonding layer, is the area to be exposed. In subsequent treating processes, the area not shielded can be illuminated by the UV light.

Optionally, the shielding layer is of total reflective material. The shielding layer of the total reflective material may reflect the UV light, and avoid increasing of temperature due to the mask absorbing the UV light. In addition, the shielding layer and the bonding layer have uniformities less than 20 µm, so as to satisfy requirements about process tests. Preferably, the total reflective material may be metal material.

It should be noted that in an embodiment, the bonding layer and/or the shielding layer are/is of a soluble material or a laser-peeling off material. For example, in a specific embodiment, the bonding layer may be of a soluble material. In that case, when the development of the product is completed, for example, when the encapsulation adhesive is exposed and cured, the bonding layer can be removed by a solution such as acetone. Because the bonding layer is located between the shielding layer and the base substrate of the open mask, the bonding layer and the shielding layer can be removed by dissolving away the bonding layer. In a further specific embodiment, both of the shielding layer and the bonding layer can be of soluble materials. Further, the shielding layer and the bonding layer can be dissolved within the acetone. In that case, when the development of the product is finished, for example when the encapsulation adhesive is exposed and cured, the bonding layer and the shielding layer can be removed by a solution such as acetone. The base substrate of the open mask would not be adversely affected in the case that the bonding layer and the shielding layer are removed by the bonding layer or the bonding layer and the shielding layer. The base substrate of the open mask after removing the membrane provided thereon can be restored to its original state, for cyclic utilization of subsequent product development. In a further embodiment, the bonding layer can be of laser-peeling off materials. Because the bonding layer is located between the shielding layer and the base substrate of the open mask, the bonding layer and the shielding layer can be removed by removing the bonding layer. In a further embodiment, the shielding layer and the bonding layer may be a laser peeling off material. In that case, when the development of the product is completed, for example, when the encapsulation adhesive is exposed and cured, the bonding layer and the shielding layer can be removed. The base substrate of the open mask would not be affected by such removal process. The base substrate of the open mask after removing the membrane provided thereon can be restored to its original state, for cyclic utilization of subsequent product development. It should be explained that the above mentioned removal process can be done by deteriorating the material of the membrane by an intense laser etching or a high temperature baking or the like, and then removing the membrane. The embodiment of the present disclosure does not make any specific limitation to this.

The alternative technical solutions as described above can be used to form an alternative embodiment of the present disclosure by combining them in any form, and they are not repeated herein.

The above embodiments are only the preferred embodiment of the present invention, and it should be noted that various modifications and changes may be made to the present disclosure by those skilled in the art without departing from the principles and spirit of the present disclosure. As such, these modifications and changes to the present disclosure are also intended to be included within the present disclosure if they fall within the scopes of the present disclosure defined by claims and equivalents thereof.

What is claimed is:

1. A method for producing a mask, wherein the mask is configured to shield light during an exposure of a product, the method comprising steps of:
    producing a composite membrane, wherein the composite membrane comprises a first protection layer, a bonding layer, a shielding layer and a second protection layer stacked in sequence;
    only cutting the first protection layer, the bonding layer and the shielding layer of the composite membrane, wherein a cutting line corresponds to a shape of an area to be exposed of the product;
    removing the first protection layer of the composite membrane and cut portions of the bonding layer and the shielding layer which have a shape corresponding to that of the area to be exposed;
    attaching the formed composite membrane onto a base substrate of an open mask, and removing the second protection layer, so as to form the mask.

2. The method as claimed in claim 1, wherein the shielding layer is of totally reflective material.

3. The method as claimed in claim 2, wherein the shielding layer is of metal material.

4. The method as claimed in claim 2, wherein the shielding layer and the bonding layer have a thickness uniformity less than 20 µm.

5. The method as claimed in claim 1, wherein the bonding layer is of soluble material or laser-peeling off material; or
    the bonding layer and the shielding layer both are of soluble materials or laser-peeling off materials.

6. The method as claimed in claim 5, wherein the bonding layer is dissolvable in acetone.

7. The method as claimed in claim 1, wherein the shielding layer and the bonding layer have a thickness uniformity less than 20 µm.

8. The method as claimed in claim 1, wherein the formed composite membrane is attached onto the base substrate of the open mask by a manual alignment or an automatic alignment performed by a double-CCD alignment system in diagonal arrangement.

9. The method as claimed in claim 1, further comprising a step of treating the mask by a defoaming process and a curing process.

10. The method as claimed in claim 9, wherein the step of treating the mask by the defoaming process and the curing process comprises placing the mask within a chamber of a high-vacuum apparatus, so as to perform the defoaming process.

11. The method as claimed in claim 10, wherein the high-vacuum apparatus is a vacuum assembling system, a vacuum heating plate or a load inter-lock vacuum chamber.

12. The method as claimed in claim 9, wherein the curing process is performed by an UV curing device or a heating plate.

13. The method as claimed in claim 9, wherein the curing process is performed with a thermosetting adhesive or an UV adhesive.

14. A mask, wherein the mask is configured to shield light during an exposure of a product, the mask comprising a base substrate of an open mask, a bonding layer attached onto the base substrate of the open mask, and a shielding layer attached onto the bonding layer;
    wherein the shielding layer and the bonding layer have a shape corresponding to that of an area except an area to be exposed of the product;
    wherein the shielding layer is of totally reflective material.

15. The mask as claimed in claim 14, wherein the shielding layer is of metal material.

16. The mask as claimed in claim 14, wherein the bonding layer is of soluble material or laser-peeling off material;
    or
    the bonding layer and the shielding layer both are of soluble materials or laser-peeling off materials.

17. The mask as claimed in claim 16, wherein the bonding layer is dissolvable in acetone.

18. The mask as claimed in claim 14, wherein the shielding layer and the bonding layer have a thickness uniformity less than 20 µm.

* * * * *